(12) United States Patent
Allen et al.

(10) Patent No.: US 7,919,225 B2
(45) Date of Patent: Apr. 5, 2011

(54) PHOTOPATTERNABLE DIELECTRIC MATERIALS FOR BEOL APPLICATIONS AND METHODS FOR USE

(75) Inventors: Robert D. Allen, San Jose, CA (US); Phillip Joe Brock, Sunnyvale, CA (US); Blake W. Davis, Hollister, CA (US); Geraud Jean-Michel Dubois, Los Gatos, CA (US); Qinghuang Lin, Yorktown Heights, NY (US); Robert D. Miller, San Jose, CA (US); Alshakim Nelson, Fremont, CA (US); Sampath Purushothaman, Yorktown Heights, NY (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 329 days.

(21) Appl. No.: 12/126,287

(22) Filed: May 23, 2008

(65) Prior Publication Data

US 2009/0291389 A1    Nov. 26, 2009

(51) Int. Cl.
 *G03F 7/038* (2006.01)
 *G03F 7/075* (2006.01)
 *G03F 7/20* (2006.01)
 *G03F 7/30* (2006.01)
 *G03F 7/40* (2006.01)

(52) U.S. Cl. ............... 430/270.1; 430/311; 430/325; 430/326; 430/330; 430/905; 430/907; 430/919; 430/921; 430/925

(58) Field of Classification Search .............. None
See application file for complete search history.

(56) References Cited

U.S. PATENT DOCUMENTS

| 5,723,257 | A  | 3/1998 | Iwasa |
| 6,613,834 | B2 | 9/2003 | Nakata et al. |
| 6,646,039 | B2 | 11/2003 | Li et al. |
| 6,689,859 | B2 | 2/2004 | Li et al. |
| 7,056,989 | B2 | 6/2006 | Hwang et al. |
| 2005/0136268 | A1 | 6/2005 | Shin et al. |

FOREIGN PATENT DOCUMENTS

JP    2007-262257    * 10/2007

OTHER PUBLICATIONS

DERWENT English abstract for JP2007-262257.*
Machine-assisted English translation of JP2007-262257 as provided by JPO.*

* cited by examiner

*Primary Examiner* — Sin J. Lee
(74) *Attorney, Agent, or Firm* — Schmeiser, Olsen & Watts

(57) ABSTRACT

A method and a composition. The composition includes at least one carbosilane-substituted silsesquioxane polymer which crosslinks in the presence of an acid. The at least one carbosilane-substituted silsesquioxane polymer is soluble in aqueous base. The method includes forming a coating on a substrate. The coating includes one or more carbosilane-substituted silsesquioxane polymers. The carbosilane-substituted silsesquioxane polymer is soluble in aqueous base. The coating is exposed to radiation, resulting in generating a latent pattern in the coating. The exposed coating is baked at a first temperature less than about 150° C. The baked coating is developed, resulting in forming a latent image from the latent pattern in the baked coating. The latent image is cured at a second temperature less than about 500° C.

19 Claims, 2 Drawing Sheets

PHOTOPATTERNABLE DIELECTRIC MATERIALS FOR BEOL APPLICATIONS AND METHODS FOR USE

FIELD OF THE INVENTION

The invention relates generally to on-chip electrical insulators used in integrated circuits, and more specifically, silicon-containing polymers as photopatternable dielectric materials.

BACKGROUND OF THE INVENTION

The continuous shrinking in dimensions of electronic devices utilized in ultra-large scale semiconductor integrated (ULSI) circuits in recent years has resulted in increasing the resistance of the back-end-of-the-line (BEOL) metallization without concomitantly decreasing the interconnect capacitances. Interconnects may be scaled to higher aspect ratios (a height to width ratio of typically greater than 3:1) to mitigate the resistance increases, which may lead to increased capacitances. This combined effect may increase signal delays in ULSI electronic devices.

The materials may be patterned by several patterning and sacrificial masking materials which may include photoresist polymers, via fill materials. Following the lithographic patterning of the masking layer, a series of etching steps may be employed to transfer the pattern from the photoresist to each of the layers underneath, including the insulating layer. The patterning of insulating materials may require as many as seven layers, some of which may be removed after patterning, resulting in a complex and inefficient process.

It would thus be highly desirable to provide a material which can reduce the integration complexity and processing steps required, and does not require costly photoresist polymers and/or significantly reduces etching processes.

SUMMARY OF THE INVENTION

The present invention relates to a composition, comprising:
at least one carbosilane-substituted silsesquioxane polymer which crosslinks in the presence of an acid, said at least one carbosilane-substituted silsesquioxane polymer soluble in aqueous base.

The present invention relates to a method, comprising:
forming a coating on a substrate, said coating comprising one or more carbosilane-substituted silsesquioxane polymers, said carbosilane-substituted silsesquioxane polymer soluble in aqueous base;
exposing said coating to radiation, resulting in generating a latent pattern in said coating;
baking said exposed coating at a first temperature less than about 150° C.;
developing said baked coating, resulting in forming a latent image from said latent pattern in said baked coating; and
curing said latent image at a second temperature less than about 500° C.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings.

DETAILED DESCRIPTION OF THE INVENTION

Figure 1:
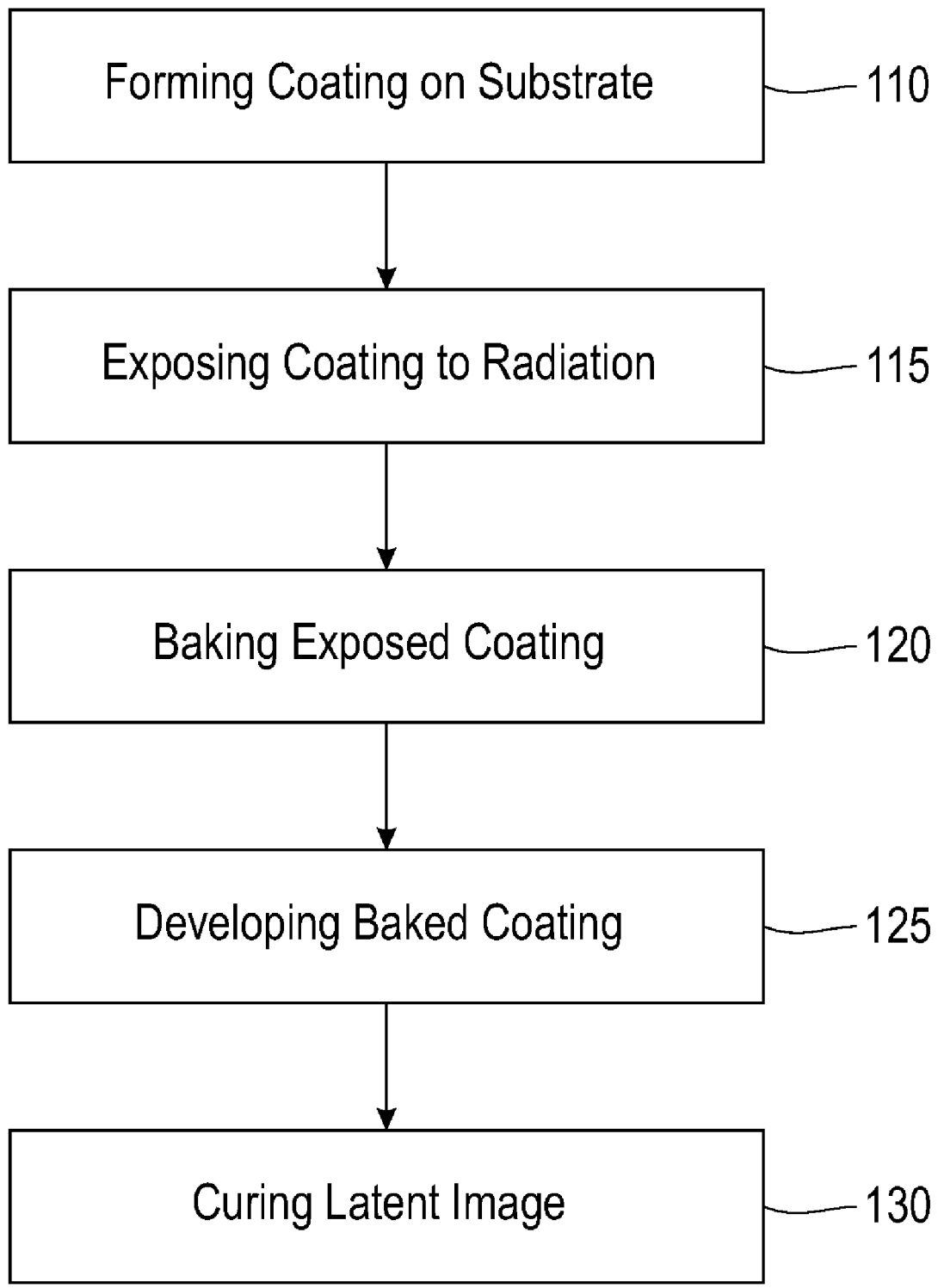
FIG. 1 is a flow chart illustrating a method, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

Described herein are various embodiments of a composition. The composition may comprise at least one carbosilane-substituted silsesquioxane polymer. The silsesquioxane polymer crosslinks in the presence of an acid, such as acid generated upon irradiation of a photosensitive acid generator. For example, the composition may comprise a negative tone photopatternable dielectric material. The carbosilane-containing silsesquioxane polymer may possess reactive alkoxy silane groups, which, in the presence of acid, may condense to form Si—O—Si bonds. This form of crosslinking enables the formation of strong chemical bonds which can withstand standard BEOL curing conditions such as UV-thermal treatment. Moreover, the presence of the carbosilane functionality (—Si—$(CH_2)_n$—Si—) in the matrix may improve the mechanical properties of the patterned features while producing a low-k insulating material (k<3.0).

The term "low-k" denotes a dielectric material having a dielectric constant (k) that is less than 3.0. Unless otherwise specified the dielectric constants mentioned herein are measured relative to that of vacuum. The composition of the polymers may be such that the fidelity of the patterns generated can be maintained throughout subsequent processing temperatures compatible with BEOL requirements.

The carbosilane-containing silsesquioxane may contain acid-sensitive imageable functional groups, such as alkoxy silanes. The polymers employed in the composition may include, but are not limited to: organosilicates, silsesquioxanes, and the like. Of the silsesquioxane polymers employed in the composition, polymer architectures may include caged, linear, branched structures or combinations thereof. Polymers of the composition may be soluble in aqueous base.

The composition may be negatively imaged to form a pattern that can then be hardened or cured via crosslinking. The crosslinking may occur thermally at temperatures above temperatures used in the imaging process. The composition may, for example, be a chemically amplified, negative-tone photoresist. The composition of the polymers may be such that the composition has a k value less than 3.0 after curing above 400° C.

The composition may be used for on-chip electrical insulators and for forming relief patterns for on-chip interconnect structures such as those used in integrated circuits, for example.

The carbosilane-substituted silsesquioxane polymer may be a linear, branched, caged compound or a combination thereof, having the following general structural formula:

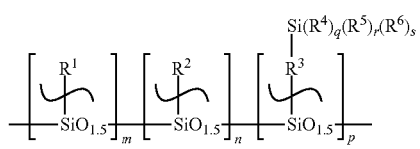

where, m, n, and p represent the number of each of the repeating units, $R^1$, $R^2$, $R^3$, $R^4$, and $R^5$ are carbon-containing groups, and $R^6$ is an alkoxy group. $R^3$, $R^4$ and $R^5$ may each independently represent a hydrocarbon group comprising 1 to about 6 carbon atoms.

$R^1$, $R^2$, $R^3$, $R^4$, $R^5$, $R^6$ may be non-identical groups. Subscripts m, n, and p represent the number of repeating units in the polymer chain. Subscripts q and r may be integers in a range from 0 to about 3. Subscript s may be an integer in a range from 1 to about 3. Subscripts m and p may be integers greater than zero. For example m and p may each independently be in a range from 1 to about 5,000. Subscript n may be an integer greater than or equal to zero. For example, n may be an integer in a range from 0 to about 5,000.

$R^1$ may represent a group which comprises one or more functional groups which provide polymer solubility in aqueous base. Each instance of $R^1$ is not limited to any specific functional group, and may comprise a functional group which is substituted with one or more —OH groups, —C(O)OH groups, —F, or combinations thereof. $R^1$ may comprise linear or branched alkyls, cycloalkyls, aromatics, arenes, or acrylics. Examples of $R^1$ include:

or the like.

$R^2$ may represent a group which comprises a carbon functionality comprising at least one carbon atom, where the carbon functionality controls polymer dissolution of the polymer into aqueous base. The structure (e.g., size, chain length, etc.) of $R^2$ may affect the dissolution rate of the polymer into aqueous base. Balancing of the dissolution-controlling group, $R^2$, with the solubility controlling group, $R^1$, allows properties such as dissolution rate and aqueous base solubility to be appropriately adjusted. $R^2$ is not necessarily limited to any specific functional group, and may comprise linear or branched alkyls, cylcoalkyls, aromatics, arenes, acrylates, or combinations thereof. Examples of $R^2$ include:

or the like.

$R^6$ is not limited to any specific alkoxy group. Examples of $R^6$ include linear or branched alkoxys, cycloalkoxy, and acetoxy groups.

The specific proportions and structures of $R^1$, $R^2$, and $R^3$ may be selected to provide a material suitable for photolithographic patterning processes.

The composition may further comprise a polysilsesquioxane having the structural formula:

where $R^7$ may comprise a carbon functional group having at least one carbon atom and wherein the subscript t represents the number of repeating units and may be an integer greater than zero. The subscript t may be in a range from about 4 to about 50,000, such as from about 10 to about 10,000 for example. $R^7$ may comprise, for example, alkyls, cycloalkyls, aryl, or combinations thereof. Examples of $R^7$ include:

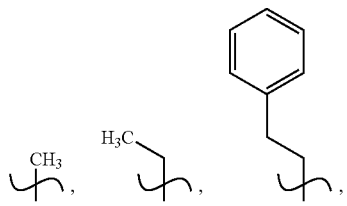

or the like.

In one embodiment, the polysilsesquioxane may be poly (methylsilsesquioxane), where $R^7$ is a methyl group, and t is an integer from about 10 to about 1,000. In other embodiments, t may be greater than 1,000. The polysilsesquioxane may comprise a copolymer. The polysilsesquioxane structure may be caged, linear, branched, or a combination thereof. The silsesquioxane polymers described herein may comprise end groups comprising silanols, halosilanes, acetoxysilanes, silylamines, alkoxysilanes, or combinations thereof, which may undergo condensation reactions in the presence of an acid (such as an acid generated by a photoacid generator under exposure to radiation), followed by thermal baking. Polymer molecules of the polysilsesquioxane may undergo chemical crosslinking with molecules of the carbosilane-substituted silsesquioxane polymer, the polysilsesquioxane, or a combination of these. In one embodiment of the present invention, the polysilsesquioxane may be the silsesquioxane polymer LKD-2056 (products of JSR Corporation) which contains silanol end groups. Such crosslinking may be not limited to silanols, but may also include halosilanes, acetoxysilanes, silylamines, and alkoxysilanes. The silsesquioxane polymers described herein may undergo chemical crosslinking, including photoacid-catalyzed crosslinking, thermally induced crosslinking, or a combination of these, such as condensation reactions of silanol end groups, for example.

The silsesquioxane polymers described herein may have a weight averaged molecular weight in the range from about 400 grams/mole (g/mol) to about 500,000 g/mol, such as from about 1500 g/mol to about 10,000 g/mol, for example.

The composition may further comprise and be miscible with a photosensitive acid generator (PAG), where the PAG generates an acid upon exposure to radiation. If a blend of polymers is used, the photosensitive acid generator may be miscible with the two or more polymers of the composition. Examples of some PAGs include: triphenylsulfonium nonaflate, (trifluoro-methylsulfonyloxy)-bicyclo[2.2.1]hept-5-ene-2,3-dicarboximide (MDT), N-hydroxy-naphthalimide (DDSN), onium salts, aromatic diazonium salts, sulfonium salts, diaryliodonium salts, and sulfonic acid esters of N-hydroxyamides, imides, or combinations thereof.

The concentrations of each of the silsesquioxane polymers in the composition may be from about 1% to about 99% weight/weight (w/w) of the total polymer composition. For example, the concentration of the second silsesquioxane polymer may be from about 5% to about 95% w/w of the total polymer composition. In one embodiment of the invention, the concentration of the second silsesquioxane polymer may be about 20% to about 80% w/w of the total polymer composition. In another embodiment, the composition of the second silsesquioxane polymer may be about 30% to about 60% w/w of the total polymer composition. In another embodiment, each of the polymers in the composition constitutes at least 5% w/w of the composition.

In optimizing the photolithography process, the composition may further comprise an organic base. The organic base may be any suitable base known in the resist art. Examples of organic bases include tetraalkylammonium hydroxides, cetyltrimethylammonium hydroxide, 1,8-diaminonaphthalene, or a combination of these. The compositions described herein are not limited to any specific selection of organic base.

The composition of the present invention may further comprise an organic crosslinking agent, such as methylphenyltetramethoxymethyl glycouril (methylphenyl POWDER-LINK), tetramethoxymethyl glycouril, methylpropyltetramethoxymethyl glycouril, or 2,6-bis(hydroxymethyl)-p-cresol.

The composition may further comprise a suitable casting solvent to dissolve the other components. The casting solvent may be used to prepare a film of the composition. Suitable casting solvents may comprise solvents such as ethoxyethylpropionate (EEP), a combination of EEP and γ-butyrolactone, propylene-glycol monomethylether alcohol and acetate, propyleneglycol monopropyl alcohol and acetate, ethyl lactate, or combinations thereof.

The substrates described herein may each comprise multiple layers or may each comprise a single layer. The substrate may have silica and silicon nitride disposed thereon, such as in the form of layers, for example. The substrate may consist essentially of silica and silicon nitride. The substrate may include a semiconducting material, an insulating material, a conductive material or any combination thereof, including multilayered structures. Thus, for example, the substrate may comprise a semiconducting material such as Si, SiGe, SiGeC, SiC, GaAs, InAs, InP and other III/V or II/VI compound semiconductors. The substrate may comprise, for example, a silicon wafer or process wafer such as that produced in various steps of a semiconductor manufacturing process, such as an integrated semiconductor wafer. The substrate may comprise a layered substrate such as, for example, Si/SiGe, Si/SiC, silicon-on-insulators (SOIs) or silicon germanium-on-insulators (SGOIs). The substrate may comprise layers such as an anti-reflective coating, a dielectric layer, a barrier layer for copper such as SiC, a metal layer such as copper, a silicon layer, a silicon oxide layer, the like, or combinations thereof. The substrate may comprise an insulating material such as an organic insulator, an inorganic insulator or a combination thereof including multilayers. The substrate may comprise a conductive material, for example, polycrystalline silicon (polySi), an elemental metal, alloys of elemental metals, a metal silicide, a metal nitride, or combinations thereof, including multilayers. The substrate may comprise ion implanted areas, such as ion implanted source/drain areas having P-type or N-type diffusions active to the surface of the substrate.

In some embodiments, the substrate may include a combination of a semiconducting material and an insulating material, a combination of a semiconducting material and a conductive material or a combination of a semiconducting material, an insulating material and a conductive material. An example of a substrate that includes a combination of the above is an interconnect structure.

The term substantially soluble, as used herein, is intended to comprise having a high enough degree of solubility in aqueous base solutions or solvents so to allow all or almost all (i.e., any remaining material is present such a small amounts so as to not interfere with subsequent processing steps) of the material (e.g., polymer, photoresist, etc.) in regions containing acid derived from the photosensitive acid generator to dissolve into aqueous base solutions or photoresist solvents. The term substantially insoluble, as used herein, is intended to comprise having such a small degree of solubility so as to not affect the quality of an image formed from a photoresist by loss of material (e.g., polymer, photoresist, etc.) through dissolution into aqueous base solution or photoresist solvents from regions of the photoresist layer not containing photosensitive acid generator derived acid. In the context of photoresist formulation and semiconductor processing, the term substantially insoluble is intended to include polymers completely or almost completely insoluble in photoresist solvents. In the context of photoresist formulation and semiconductor processing, the term substantially soluble is intended to include polymers completely or almost completely soluble in photoresist solvents. In general, the polymer dissolution rates affect the dissolution rates of the photoresist layers most strongly; thus, a substantially insoluble polymer may render substantially insoluble a photoresist comprising that polymer. Substantially insoluble photoresists have a dissolution rate of less than about 0.2 nanometers/second (nm/s) in solvent or aqueous base, while substantially soluble photoresists have a dissolution rate of greater than about 5 nm/s in solvent or aqueous base. Photoacid generators, quencher and other additives may also alter the dissolution rates of the final photoresist layer.

The compositions, coatings, and latent images described herein may be patternwise imaged or otherwise exposed to radiation using radiation such as ultraviolet (UV), such as radiation having wavelengths of approximately 436 nanometers (nm) and 365 nm, deep-ultraviolet (DUV) such as wavelengths of approximately 257 nm, 248 nm, 193 nm, and 157 nm, extreme-ultraviolet (EUV) such as a wavelength of approximately 4 nm to approximately 70 nm such as approximately 13 nm, x-ray, electron beam, combinations of these, and the like. Various wavelengths of radiation may be used such as 313 nm, 334 nm, 405 nm, and 126 nm, etc., where the sources may be mainly from specific mercury emission lines or specific lasers. For high performance lithography, single wavelength and/or narrow band radiation sources may be used. For less stringent conditions, a broad band multiple wavelength source may be used. The appropriate radiation wavelength may depend on the components of the overall photoresist composition (e.g., the selection of the organic base, photosensitive acid generator (PAG), base (or quencher), surfactant, solvent, etc.).

FIG. 1 is a flow chart illustrating a method. Step 110 comprises forming a coating on a substrate, where the coating may comprise one or more carbosilane-substituted silsesquioxane polymers, where the carbosilane-substituted silsesquioxane polymers are soluble in aqueous base. For example, the one or more carbosilane-substituted silsesquioxane polymers may comprise one or more of the carbosilane-substituted silsesquioxane polymers described above.

The coating formed in step 110 may be formed by processes such as spin coating, spray coating, dip coating, doctor-blading, and the like, which may be used individually and in combinations thereof in accordance with the methods of the present invention.

Step 115 comprises exposing the coating to radiation, resulting in generating a latent pattern in the coating. For example, the coating may be patternwise imaged through a mask, wherein at least one region of the coating is exposed to radiation. The resulting latent pattern may comprise the exposed at least one region and unexposed regions of the coating. The coating may further comprise a photosensitive acid generator which generates an acid upon exposure to radiation, resulting in production of an acid catalyst in the at least one exposed region of said coating.

Figure 2:
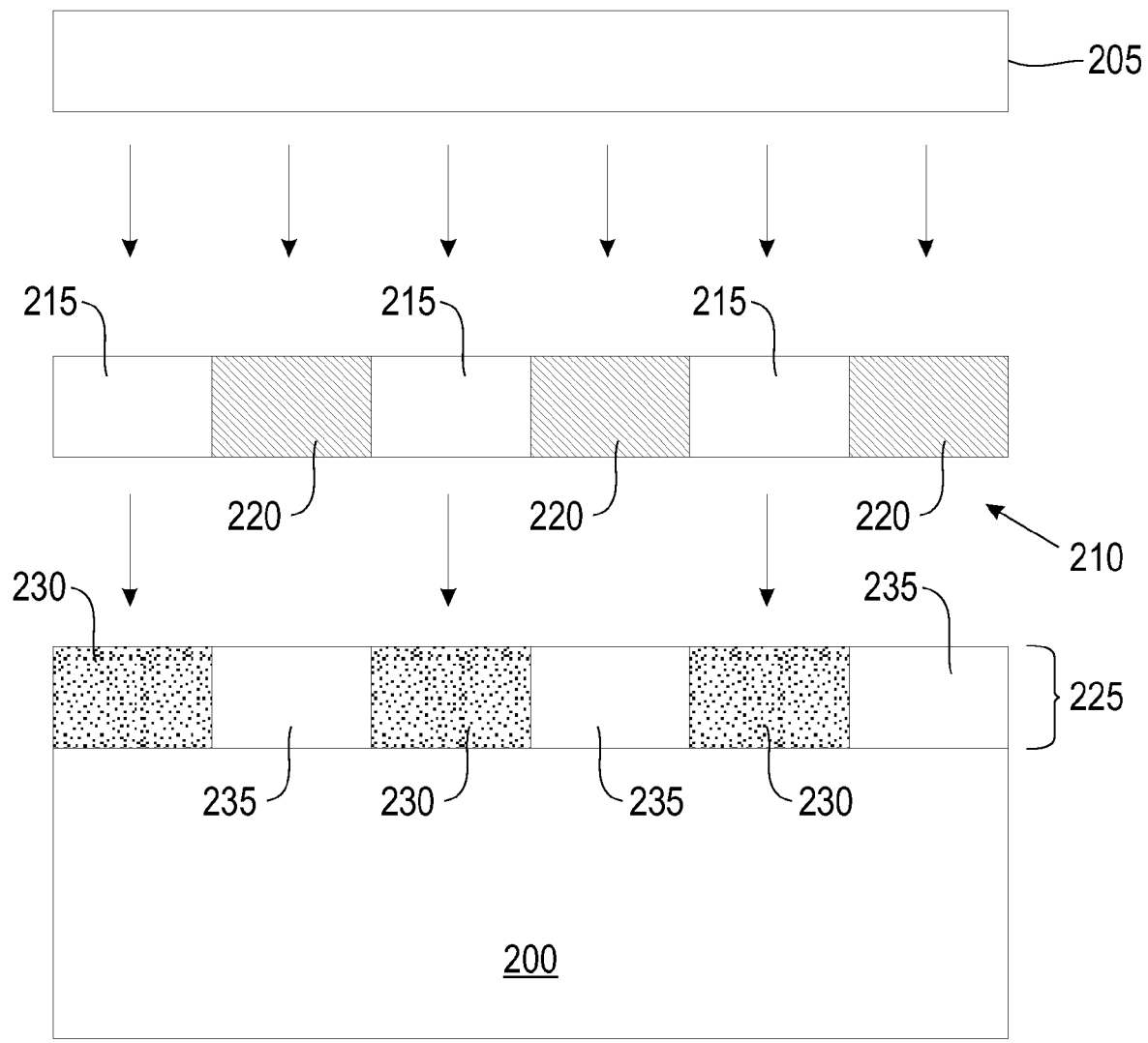
FIG. 2 is an illustration of exposing to radiation a coating disposed on a substrate, in accordance with embodiments of the present invention.

FIG. 2 is an illustration of exposing to radiation a coating 225 disposed on a substrate 200, wherein a radiation source 205 projects radiation through a patterned mask 210 onto the film 225 disposed on a substrate 200. The mask may have a pattern of masked sections 220 which are essentially opaque to the radiation, and unmasked sections 215 which are essentially transparent to the radiation. Radiation passing through the unmasked sections 215 may be transmitted to the coating 225 to be absorbed in the exposed regions 230 of the coating 225, wherein the radiation may induce the production of an acid catalyst in the exposed regions 230 of the coating 225. Unexposed regions 240 may not produce an acid catalyst. The pattern of exposed regions 230 and unexposed regions 240 may form a latent pattern in the coating 225. For a negative-tone resist composition, exposure to the radiation (such as ultraviolet (UV) light at a wavelength from about 12 nm to about 1000 nm, electron beam radiation, plasma, etc.) followed by a post exposure bake may render the exposed regions 230 substantially insoluble in a developer.

Referring again to FIG. 1, step 120 comprises baking the exposed coating at a first temperature less than about 150° C. The post-exposure baking temperature may be less than about 200° C., such as in a range from about 35° C. to about 200° C., such as in a range from about 80° C. to about 120° C., for example. In some embodiments, the post-exposure bake is at a temperature less than about 150° C., such as in a range from about 35° C. to about 200° C., such as in a range from about 80° C. to about 120° C.

Step 125 comprises developing the baked coating, resulting in forming a latent image from the latent pattern formed in step 120 in the baked coating. The coating may developed in a base solution, where the base-soluble unexposed regions of the film are removed from the coating to leave a negative-tone latent image remaining from the exposed regions of the coating. The developer may be organic or aqueous based, such as an alkaline aqueous developer, such as tetramethylammonium hydroxide (TMAH) for example.

The baking following the exposure to radiation of step 115 may result in inducing crosslinking in the exposed regions of the coating, such as through silanol end groups in the polymers of the composition. The acid-sensitive crosslinking during the post-exposure bake may occur in the presence of an acid generated by a photosensitive acid generator under exposure to radiation in step 115.

Step 130 comprises curing the latent image formed in step 125 at a temperature less than about 500° C. A final curing step at a processing temperature compatible with back-end-of-line (BEOL) requirements may improve the latent image properties, such as the dielectric constant, without detriment to image pattern fidelity. Curing may comprise thermal treatment of the baked coating and latent image at a temperature of about 500° C. or less. Curing may comprise exposing the relief pattern to UV radiation, heat, electron beam irradiation, plasma, or a combination of any of these techniques, such as thermal treatment in combination with UV radiation at a temperature in a range from about 400° C. to about 500° C., for example.

Where appropriate, the following techniques and equipment were utilized in the Examples: $^1$H and $^{13}$C NMR spectra were obtained at room temperature on an Avance 400 spectrometer. Quantitative $^{13}$C NMR was run at room temperature in acetone-$d_6$ in an inverse-gated $^1$H-decoupled mode using Cr(acac)$_3$ as a relaxation agent on an Avance 400 spectrometer. For polymer composition analysis $^{19}$F NMR (379 MHz) spectra were also obtained using a Bruker Avance 400 spectrometer. Thermo-gravimetric analysis (TGA) was performed at a heating rate of 5° C./min in $N_2$ on a TA Instrument Hi-Res TGA 2950 Thermogravimetric Analyzer. Differential scanning calorimetry (DSC) was performed at a heating rate of 10° C./min on a TA Instruments DSC 2920 modulated differential scanning calorimeter. Molecular weights were measured using gel permeation chromatography (GPC) in tetrahydrofuran (THF) on a Waters Model 150 chromatograph relative to polystyrene standards. IR spectra were recorded on a Nicolet 510 FT-IR spectrometer on a film cast on a KBr plate. Film thickness was measured on a Tencor alpha-step 2000. A quartz crystal microbalance (QCM) was used to study the dissolution kinetics of the resist films in an aqueous tetramethylammonium hydroxide (TMAH) solution (CD-26).

Example 1

Synthesis of Poly(4-hydroxy-α-methylbenzylsilsesquioxane-,α-methylbenzylsilsesquioxane, and vinylsilsesquioxane) (70:15:15 pHMBS/MBS/VinylS)

A mixture of 1-trichlorosilyl-1-(4-acetoxyphenyl)-ethane (83.3 grams (g); 0.28 mole), 1-trichlorosilyl-1-phenyl-ethane (14.38 g; 0.06 mole), vinyl trichlorosilane (9.87 g, 0.06 mole) and 122 g of anhydrous tetrahydrofuran (THF) were added drop-wise to a rapidly stirred mixture of diethylamine (96.5 g; 1.32 mole) and 122 g of deionized water while cooling with an ice bath to maintain the reaction temperature in a range from about 0° C. to about 10° C. After the addition was complete the mixture was stirred at about 0° C. to about 10° C. for about one hour. The cooling bath was removed and the mixture was allowed to warm to room temperature and stir for an additional 20 hours. The reaction mixture was placed in a separatory funnel and the lower layer was separated and retained. The upper layer was diluted with 280 milliliters (ml) deionized water and extracted three times with 140 ml of diethyl ether. The ether extracts were combined with the lower layer retained from the first separation and the ether solution was washed four times with 200 ml of 2% aqueous hydrochloric acid, and four times with 200 ml of deionized water. The ether solution was evaporated to yield 77.9 g of a hard foam after drying under high vacuum to constant weight.

A 76 g portion of the dry foam product formed above was dissolved in 76 g of toluene, heated to 90° C. with stirring, 40% aqueous tetrabutylammonium hydroxide (0.872 g, 1.34 millimoles (mmoles)) was added and the mixture was heated to reflux under nitrogen while collecting azeotroped water in a Dean-Stark trap. After 36 hours of reflux the reaction temperature had increased from about 103° C. to 111° C. Analysis of a reaction aliquot by GPC indicated that the molecular weight (Mw) was about 4 kilodaltons (kDa). The reaction mixture was cooled and precipitated in 3 liters of stirred hexanes, collected on a filter funnel and washed 3 times with 150 ml of hexanes. After drying to constant weight, 66 g of solid was obtained.

The solid was added portion-wise to a stirred mixture of 42 ml of ammonium hydroxide (12.4 N aqueous solution) in 312 ml of methanol at about 50° C. The suspension was heated to reflux and became homogenous after about 20 minutes at reflux. The solution was refluxed for an addition 3 hours. The reaction solution was then cooled to room temperature, and the polymer isolated by precipitation into a stirred mixture of 42 g of acetic acid and 3.5 liters of deionized water. The solid product was isolated by filtration and washed with six 100 ml portions of deionized water. Drying in a vacuum oven for several days at 60° C. yielded 53.3 g of poly(HMBS/MBS/VinylS) product with a Mw of 3.3 kDa.

Example 2

Synthesis of Poly(4-hydroxy-α-methylbenzylsilsesquioxane-,α-methylbenzylsilsesquioxane, and dimethylethoxysilylethylsilsesquioxane) (70:15:15 pHMBS/MBS/DMES)

A mixture of 70:15:15 pHMBS/MBS/VinylS (20 g) and dimethylethoxysilane (2 ml) were dissolved in THF (50 ml) under nitrogen atmosphere. A solution of Karstedt's catalyst (3.5% in xylene, 100 microliters (μl) was added and the reaction mixture stirred at ambient temperature for 3 hours. The polymer was isolated by precipitation in water, redissolved in acetone, and then reprecipitated in hexanes. The product was dried overnight in a vacuum oven at 50° C. to afford 17 g of polymer product.

Example 3

Photopatternable Composition

A patternable low-k composition was formulated with 10 g of a 20 weight % (wt %) solution of 70:15:15 pHMBS/MBS/DMES, 0.2 g of a 20 wt % solution of triphenylsulfonium nonaflate in propylene glycol monomethyl ether acetate (PGMEA), and 0.22 g of a 0.5 wt % solution of a base in PGMEA. The resulting low-k formulation was filtered through a 0.2 micron (μm) filter.

The low-k composition was spin coated onto an 8 inch silicon wafer having a layer of the anti-reflective coating DUV42P (available from Brewer Science, Inc., Rolla, Mo.) deposited thereon, and pre-exposure baked at 110° C. for 60 seconds (s), patternwise exposed to 248 nm DUV light on an ASML (0.63 NA, ⅝ annular) DUV stepper, and post exposure baked at 110° C. for 60 s. This was followed by a 30 s puddle development step with 0.26 N TMAH developer to resolve 0.170 μm line and space features.

Example 4

Photopatternable Composition

A patternable low-k composition was formulated with 6 g of a 20 wt % solution of 70:15:15 pHMBS/MBS/DMES, 4.0 g of a 20 wt % LKD-2056 resin solution, 0.2 g of a 20 wt % solution of triphenylsulfonium nonaflate in PGMEA, and 0.22 g of a 0.5 wt % solution of a base in PGMEA. The resulting low-k formulation was filtered through a 0.2 μm filter.

The low k composition was spin coated onto an 8 inch silicon wafer having a layer of the anti-reflective coating DUV42P (available from Brewer Science, Inc., Rolla, Mo.) deposited thereon, and pre-exposure baked at 110° C. for 60 s, patternwise exposed to 248 nm DUV light on an ASML (0.63 NA, ⅝ annular) DUV stepper, and post exposure baked at 110° C. for 60 s. This was followed by a 30 s puddle development step with 0.26 N TMAH developer to resolve 0.180 μm line and space features.

Example 5

Pattern Integrity

The patternable composition formulated in Example 3 was spin coated onto an 8 inch silicon wafer having a layer of the anti-reflective coating DUV42P (available from Brewer Science, Inc., Rolla, Mo.) deposited thereon, and pre-exposure baked at 110° C. for 60 s, patternwise exposed to 248 nm DUV light on an ASML (0.63 NA, ⅝ annular) DUV stepper, and post exposure baked at 110° C. for 60 s. This was followed by a 30 s puddle development step with 0.26 N TMAH developer. The patterned film was subjected to a UV-thermal cure at 400° C. for 1 h under a $N_2$ atmosphere and showed no loss in pattern fidelity. The resultant film had a dielectric constant of 2.7 at 23° C.

Example 6

Pattern Integrity

The patternable composition formulated in Example 4 was spin coated onto an 8 inch silicon wafer having a layer of the anti-reflective coating DUV42P (available from Brewer Science, Inc., Rolla, Mo.) deposited thereon, and pre-exposure baked at 110° C. for 60 s, patternwise exposed to 248 nm DUV light on an ASML (0.63 NA, ⅝ annular) DUV stepper, and post exposure baked at 110° C. for 60 s. This was followed by a 30 s puddle development step with 0.26 N TMAH developer. The patterned film was subjected to a UV-thermal cure at 400° C. for 1 h under a $N_2$ atmosphere and showed no loss in pattern fidelity. The resultant film had a dielectric constant of 2.7 at 23° C. The Young's modulus for the resultant film as determined by surface acoustic wave spectroscopy was 8.17 gigapascals (GPa).

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed:

1. A composition, comprising:
  at least one carbosilane-substituted silsesquioxane polymer which crosslinks in the presence of an acid, said at least one carbosilane-substituted silsesquioxane polymer soluble in aqueous base,
  wherein said at least one carbosilane-substituted silsesquioxane polymer comprises:

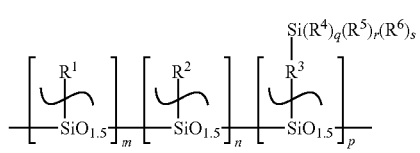

wherein, m, n, and p are integers greater than zero, wherein $R^1$, $R^2$, $R^3$, $R^4$, and $R^5$ are carbon-containing groups, and $R^6$ is an alkoxy group,
  wherein subscripts q and r are integers in a range from 0 to about 3, and
  wherein subscript s is an integer in a range from about 1 to about 3.

2. The composition of claim 1, wherein $R^1$ represents a group comprising one or more functional groups providing polymer solubility in aqueous base, wherein $R^2$ represents a group comprising a carbon functionality having at least one carbon atom, and wherein $R^3$, $R^4$, and $R^5$ each independently represents a hydrocarbon group comprising 1 to about 6 carbon atoms.

3. The composition of claim 1, wherein said composition has a dielectric constant, k, less than about 3.0 after it has been cured.

4. The composition of claim 1, wherein $R^1$ comprises a functional group substituted with at least one other functional group selected from the group consisting of —OH, —C(O)OH, —F, and combinations thereof.

5. The composition of claim 1, wherein $R^1$ is selected from the group consisting of

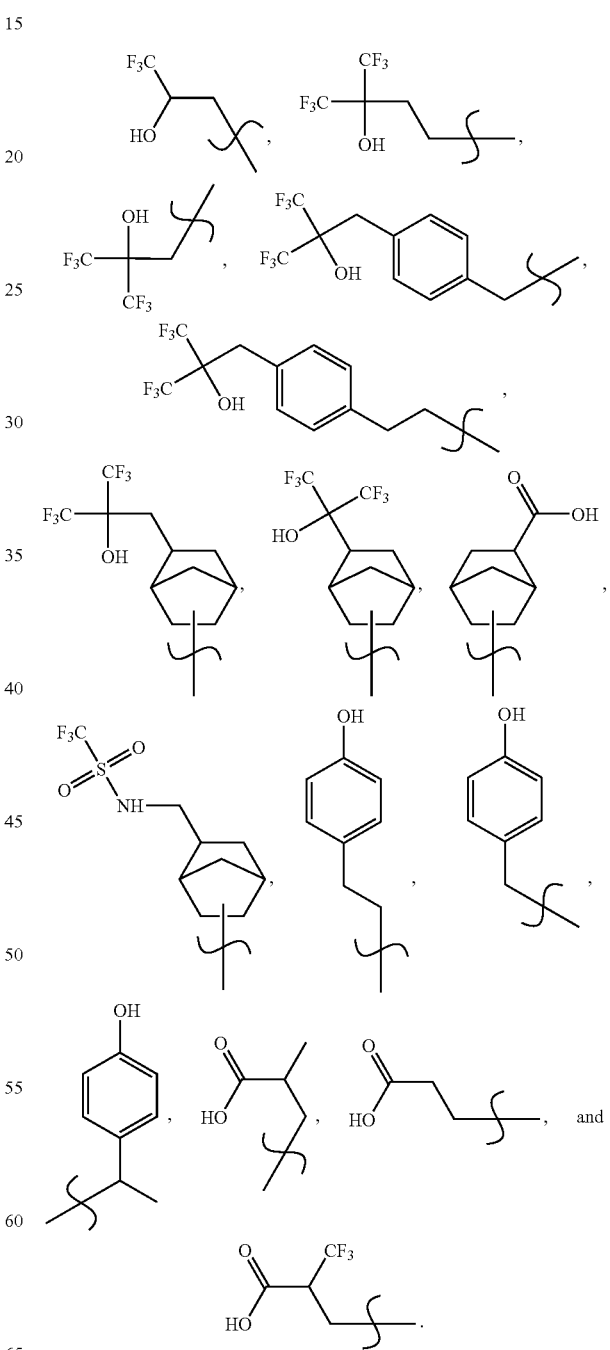

6. The composition of claim 1, wherein $R^2$ is selected from the group consisting of:

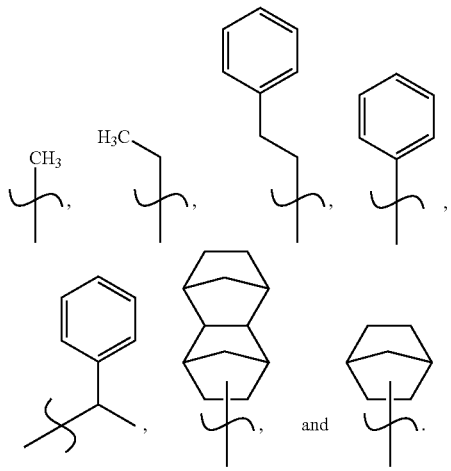

7. A method of forming the composition of claim 1, comprising:
synthesizing said at least one carbosilane-substituted silsesquioxane polymer by a hydrosilation process.

8. A composition, comprising:
at least one carbosilane-substituted silsesquioxane polymer which crosslinks in the presence of an acid, said at least one carbosilane-substituted silsesquioxane polymer soluble in aqueous base,
said composition further comprising a polysilsesquioxane having the structural formula:

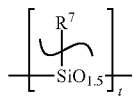

wherein $R^7$ comprises a carbon functional group having at least one carbon atom, and
wherein the subscript t is an integer greater than zero.

9. The composition of claim 8, where $R^7$ is selected from the group consisting of alkyls, cycloalkyls, aryl, and combinations thereof.

10. The composition of claim 8, wherein $R^7$ is selected from the group consisting of

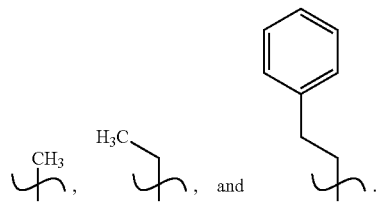

11. The composition of claim 8, wherein t is an integer from about 10 to about 10,000.

12. A method, comprising:
forming a coating on a substrate, said coating comprising one or more carbosilane-substituted silsesquioxane polymers, said carbosilane-substituted silsesquioxane polymer soluble in aqueous base;
exposing said coating to radiation, resulting in generating a latent pattern in said coating;
baking said exposed coating at a first temperature less than about 150° C.;
developing said baked coating, resulting in forming an image from said latent pattern in said baked coating; and
curing said image at a second temperature less than about 500° C.

13. The method of claim 12, wherein at least one of said one or more carbosilane-substituted silsesquioxane polymers comprises:

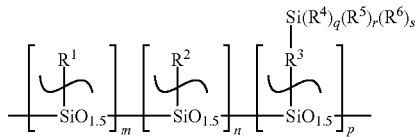

wherein, m, n, and p are integers greater than zero, wherein $R^1$, $R^2$, $R^3$, $R^4$, and $R^5$ are carbon-containing groups, and $R^6$ is an alkoxy group, wherein subscripts q and r are integers in a range from 0 to about 3, and wherein subscript s is an integer in a range from about 1 to about 3.

14. The method of claim 12, wherein said curing comprises exposing said image to ultraviolet (UV) radiation, heat, electron beam irradiation, plasma, or a combination thereof.

15. The method of claim 12, wherein said coating further comprises a polysilsesquioxane having the structural formula:

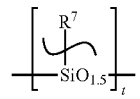

wherein $R^7$ comprises a carbon functional group having at least one carbon atom and selected from the group consisting of alkyls, cycloalkyls, aryl, and combinations thereof, and the subscript t is an integer greater than zero.

16. The method of claim 15, wherein said polysilsesquioxane has end groups selected from the group consisting of silanol, halosilane, acetoxysilane, silylamine, and alkoxysilane.

17. The method of claim 12, wherein said coating further comprises a photosensitive acid generator, said photosensitive acid generator selected from the group consisting of N-(trifluoromethylsulfonyloxy)-bicyclo[2.2.1]hept-5-ene-2, 3-dicarboximide, onium salts, aromatic diazonium salts, sulfonium salts, diaryliodonium salts, sulfonic esters of N-hydroxyamides, sulfonic esters of N-hydroxyimides, N-hydroxy-napthalimide, and combinations thereof.

18. The method of claim 17, wherein said exposing comprises:
patternwise imaging said coating through a mask, wherein at least one region of said coating is exposed to radiation, resulting in production of an acid catalyst in said at least one exposed region of said coating, said latent pattern comprising said exposed at least one region and unexposed regions of said coating.

19. The method of claim 18, wherein resulting from said baking, said at least one exposed region is rendered substantially insoluble in a base developer, and said developing results in removal of said unexposed regions of said coating.

* * * * *